United States Patent [19]
Maier et al.

[11] Patent Number: 5,440,307
[45] Date of Patent: Aug. 8, 1995

[54] METHOD AND FACILITY FOR TIME/VOLTAGE CONVERSION

[75] Inventors: Michael Maier, Villingen-Schwenningen, Germany; Eric Benoit, Eybens, France

[73] Assignee: Deutsche Thomson-Brandt GmbH, Villingen-Schwenningen, Germany

[21] Appl. No.: 97,704

[22] Filed: Jul. 27, 1993

[30] Foreign Application Priority Data

Feb. 8, 1991 [DE] Germany .................. 41 03 813.4

[51] Int. Cl.6 ............................................ H03M 1/82
[52] U.S. Cl. ............................. 341/152; 341/144
[58] Field of Search ........... 341/118, 144, 152, 122, 341/124

[56] References Cited

U.S. PATENT DOCUMENTS

| | | | |
|---|---|---|---|
| 4,233,591 | 11/1980 | Murata et al. | 341/145 |
| 4,562,424 | 12/1985 | Takagi et al. | 341/166 |
| 4,590,457 | 5/1986 | Amir | 341/145 |
| 4,716,398 | 12/1987 | Eccleston et al. | 341/118 |
| 4,965,867 | 10/1990 | Tsuchida et al. | 341/118 |
| 5,192,922 | 3/1993 | Jordan | 332/109 |
| 5,206,632 | 4/1993 | Dupont et al. | 340/784 |
| 5,245,593 | 9/1993 | Yamate | 368/156 |

FOREIGN PATENT DOCUMENTS

417578A2 3/1991 European Pat. Off. .
1397411 6/1975 United Kingdom .

OTHER PUBLICATIONS

NTIS Technical Notes., "Pulse-Width-to-Analog-Voltage Converter", by G. Sosack et al., No. 3B, Mar. 1986, Springfield, Va., p. 282.
Patent Abstracts of Japan, vol. 6, No. 119 (E-116) (997) 3. Jul. 1982. & JP, A, 57 048 826 (Nippon Denki Kiki K.K.) 20 Mar. 1982.
Patent Abstracts of Japan, vol. 15, No. 20 (P-1154) 17 Jan. 1991 & JP, A,2 264 295 (Sharp Corp.) 29 Oct. 1990.

*Primary Examiner*—Marc S. Hoff
*Attorney, Agent, or Firm*—Joseph S. Tripoli; Eric P. Herrmann; Donald H. Kurdyla

[57] ABSTRACT

A more accurate voltage-to-time and then time-to-voltage conversion is accomplished by tailoring the amplitude versus time characteristics of the pulses generated in the voltage-to-time conversion. One embodiment includes applying a ramped voltage supply to an amplifier coupled between the voltage/time converter and the time/voltage converter. The ramped supply is arranged to condition the amplitude of a portion of respective pulses to include a slope similar to the ramped voltage applied to the time/voltage converter. This tends to effect a more accurate response in the time/voltage converter.

12 Claims, 3 Drawing Sheets

5,440,307

METHOD AND FACILITY FOR TIME/VOLTAGE CONVERSION

This is a continuation of PCT application PCT/EP92/000219 filed Feb. 1, 1992.

BACKGROUND OF THE INVENTION

The invention relates to a method and device for converting a pulse width modulated signal into corresponding amplitude values.

DESCRIPTION OF THE PRIOR ART

U.S. Pat. No. 5,206,632 describes driver circuitry for applying image signals to a liquid crystal display. This circuitry includes a current amplifier formed from a combination of a voltage/time converter and a time/voltage converter. The voltage/time converter converts a video input signal into a pulse width modulated signal with pulses of differing duration based on the amplitude of the video input signal. The time/voltage converter subsequently converts the pulse width modulated signal into a voltage value based on the duration of the respective pulse.

One realization of the time/voltage converter presented includes an MOS transistor. The pulse width modulated signal is applied to the gate of the MOS transistor. A ramp voltage of sawtooth like signal is applied to the source electrode of the MOS transistor. A capacitor is connected to the drain electrode and charged by the ramp voltage during the pulse intervals. At the termination of respective pulses, the voltage exhibited by the ramp is stored on the capacitor until the occurrence of the next pulse.

The voltage/time converter, according to U.S. Pat. No. 5,206,632, supplies pulses having differing pulse widths but substantially constant amplitudes. Constant amplitude pulses tend not to permit time/voltage conversion with requisite accuracy.

SUMMARY OF THE INVENTION

The object of the present invention is to enable a more accurate conversion of time values, corresponding to pulse durations, into amplitude values. This task is accomplished by tailoring the amplitude versus time characteristics of the generated pulses. One embodiment includes applying a ramped voltage supply to an amplifier coupled between the voltage/time converter and the time/voltage converter. The ramped supply is arranged to condition the amplitude of a portion of respective pulses to include a slope similar to the ramped voltage applied to the time/voltage converter. This tends to effect a more accurate response in the time/voltage converter.

A further advantage of this invention is that it lowers electrical stress in the transistors used.

The blocks shown individually in the figures merely serve to aid a better understanding of the invention. Usually, individual blocks or several; of these blocks are combined into units. These can be realized in integrated or hybrid technology or as a program-controlled microcomputer, or as a part of a program suitable for its control. Moreover, the elements contained in the individual stages may also be provided separately.

Figure 1:
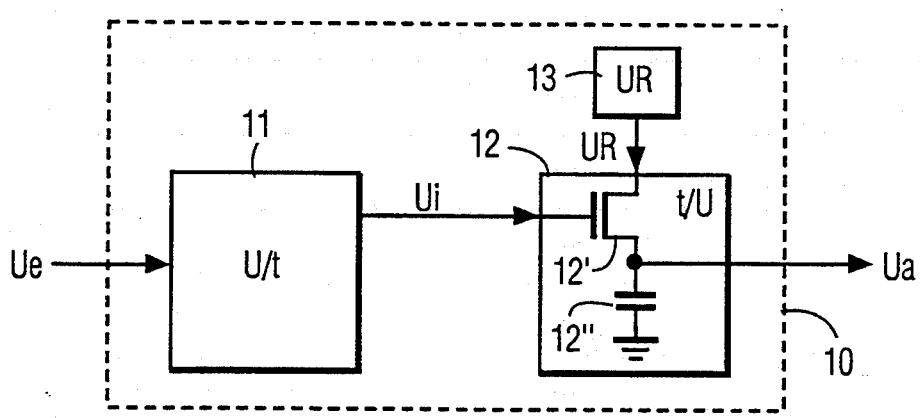
FIG. 1 is a partial block, partial schematic diagram of a known voltage time converter and time/voltage converter system.

FIG. 1 shows known amplification circuitry 10 containing a voltage/time converter (U/t converter) 11 and a time/voltage converter (t/U converter) 12. The voltage/time converter 11 forms a pulse width modulated signal Ui from an input signal Ue. The signal Ui is coupled to a first input of t/U converter 12. A voltage ramp, Ur, provided by a source 13 is coupled to a second input of the t/U converter. The t/U converter 12 forms an output signal Ua as a function of both the signal Ui and ramp voltage UR.

The time/voltage converter 12 may consist of an MOS transistor 12', with a source terminal fed by ramp voltage UR and a drain terminal coupled to a first terminal of a capacitor 12". A second terminal of capacitor 12" is connected to ground. The signal Ui is applied to the gate connection of the transistor 12'. The output signal Ua is available at the junction of the transistor 12' and capacitor 12".

The method of operation of the amplifier system 10 of FIG. 1 is described in the aforementioned U.S. Pat. No. 5,206,632 (incorporated herein by reference) and will only be explained as is necessary for the understanding of the present invention.

The voltage/time converter 11 generates pulses of variable width. Idealized pulses are shown by the dotted lines in FIGS. 2a–2c. These pulses have differing temporal lengths t1, t2, or t3 respectively, depending on the different input voltages UE fed to the voltage/time converter 11. Their amplitudes are essentially constant over the entire duration of the pulse.

Figure 2A:
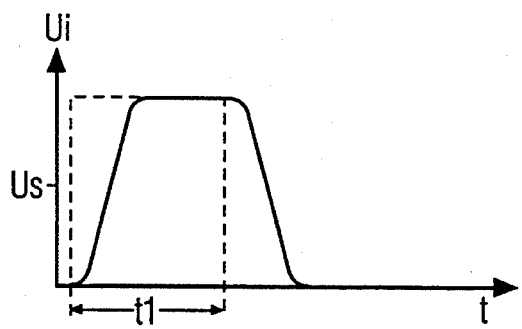
FIGS. 2a–2c are time/voltage waveforms useful for an understanding of the FIG. 1 system.
Figure 2B:
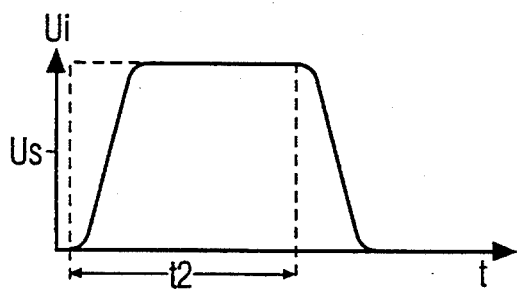
Figure 2C:
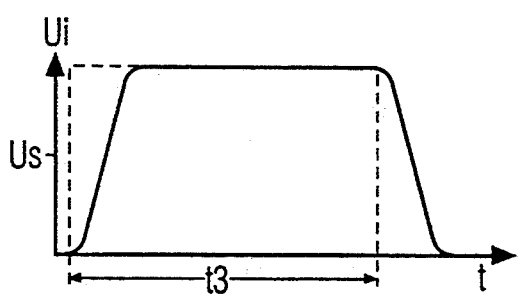

In FIGS. 2a–2c, solid (continuous) lines are more representative of the actual pulse waveforms that are supplied to the time/voltage converter 12 from the voltage/time converter 11. These curves deviate from the idealized curves in that they have finite rising and falling transitions. A threshold value Us is shown at about half amplitude, the significance of which will be explained below.

Figure 3:
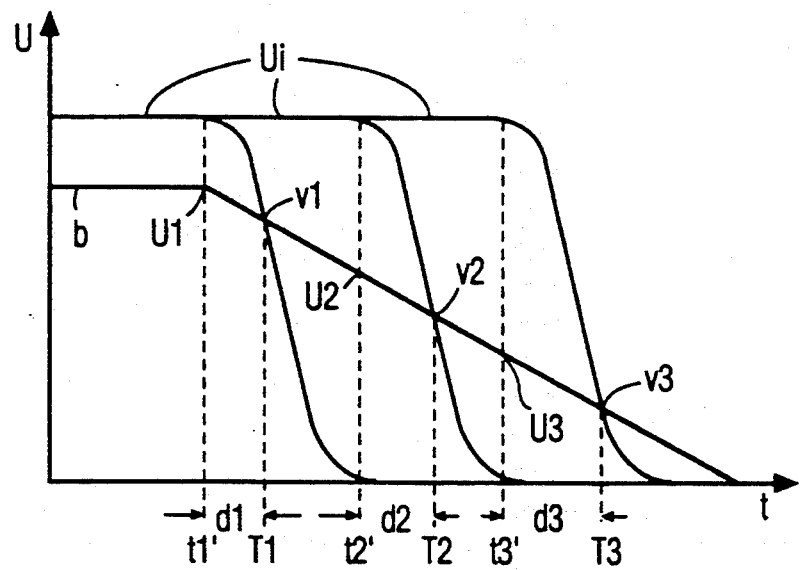
FIG. 3 is a waveform diagram illustrating the transfer functions of the FIG. 1 system.

Referring to FIG. 3, the curves Ui correspond to the right-hand edges (falling transitions) of the actual pulses shown in FIGS. 2a–2c. The curve b in FIG. 3 represents the ramp voltage UR applied to the source electrode of transistor 12'. In this known circuitry, ramp voltage UR may, for example, exhibit a ramp form only after time period t1 expires. As a result, capacitor 12" (in FIG. 1) is first fully charged and the voltage Ua applied to it is subsequently primarily determined by ramp voltage UR. The transistor 12' is thus conditioned by the pulses applied to its gate connection to track and hold the ramp signal applied to its source electrode.

The time/voltage converter 12 (in FIG. 1) produces an output voltage Ua value determined at the time curve Ui intersects the curve b as shown in FIG. 3. Since the time/voltage conversion occurs through use of semiconductor components, appropriate threshold values are considered when determining curve b.

At time t1', when the first idealized pulse (as drawn in FIG. 2a) terminates, curve b equals value U1. However, due to rounding off, the actual curve of the first pulse intersects the curve b at time T1=t1+d1 at voltage v1. At time t2' when the second idealized pulse (as shown in FIG. 2b) terminates, curve b has the value U2. Again, due to rounding, the actual second pulse intersects the curve b at time T2=t2'+d2 when the voltage equals v2. In an analogous manner, the actual edge of the third pulse (from FIG. 2c) intersects the curve b at a time T3=t3'+d3 when the voltage value is v3.

The differences (v1−U1), (v2-U2) and (v3-U3) corresponding to times d1, d2, and d3 respectively, are not of equal magnitude. The resulting function has a regular-shaped edge progression due to the varying lengths of the time differences d1, d2, and d3. Therefore, nonlinearities appear in the time/voltage conversion of the FIG. 1 system.

Two exemplary embodiments of the present invention are shown with reference to FIGS. 4 through 7. In these figures, elements and voltages that perform the same function or produce the same effect as in FIGS. 1 through 3 have the same reference designations.

Figure 4:
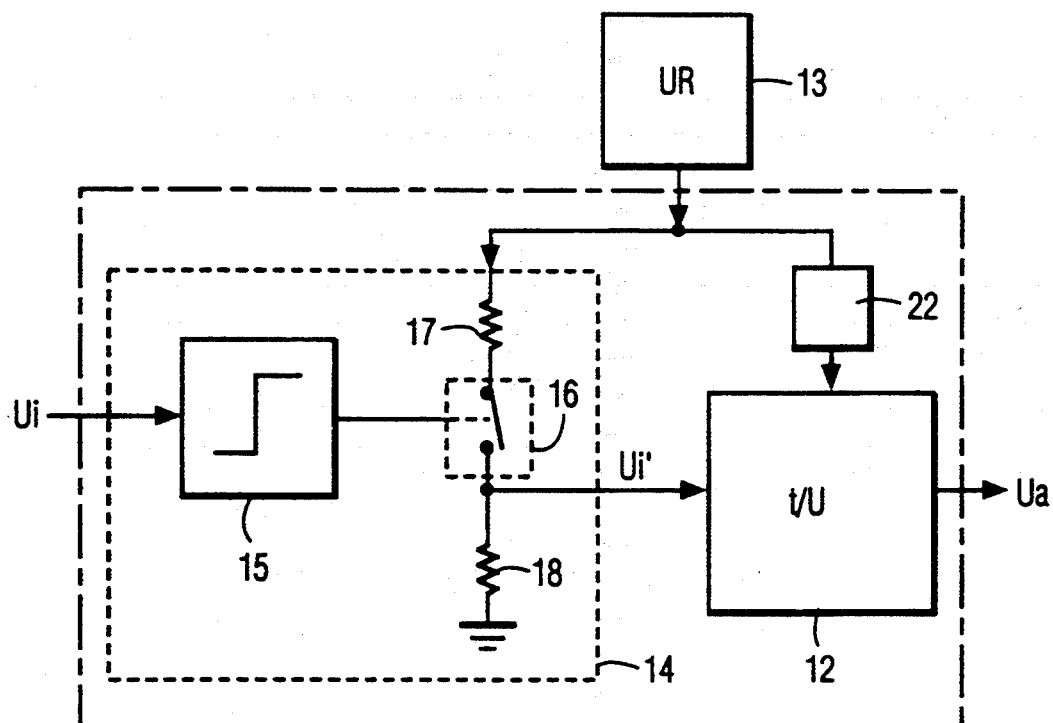
FIG. 4 is a partial block, partial schematic diagram of a voltage/time, time/voltage conversion system embodying the present invention.

Referring to FIG. 4, a time/voltage converter 12a includes a pulse converter 14 containing a threshold stage 15 which receives the pulse signal Ui and an output coupled to a control input terminal of a switch 16. The conduction path of the switch 16 is coupled between resistors 17 and 18. Resistor 18 is connected to a reference potential (drawn in FIG. 4 as ground potential). Resistor 17 is coupled to the source 13 of ramp signal UR.

Ramp signal UR is applied to the time/voltage converter 12 through an attenuator 22 which reduces the amplitude of the ramp voltage signal UR. The attenuation may occur in an additive manner, for example, by subtracting a voltage, and/or in a multiplicative manner, for example, by amplification by a factor less than one. The attenuator 22 couples this reduced ramp voltage to the second input of the time/voltage converter 12.

The operation of this embodiment will be explained using FIGS. 2a-2c and FIGS. 5a-5c.

The signal Ui, which exhibits the actual pulse as shown in FIG. 2, is supplied to threshold stage 15. Threshold stage 15 conditions the switch to conduct 16 when the predetermined threshold value Us is exceeded to produce the connection between the resistors 17 and 18. When the threshold value Us is no longer exceeded, the threshold stage renders the switch 16 non-conductive. The waveform of an appropriate trigger signal for the switch 16 essentially corresponds to the idealized pulses of FIG. 2. The position of the threshold value Us is preferably determined conditional upon the rounding-off of the actual pulse Ui (FIG. 2) such that the time the switch 16 is closed corresponds to the duration of the ideal pulse Ui (FIG. 2).

When the switch 16 is closed, the resistors 17 and 18 form a voltage divider. True pulses of a signal Ui', i.e., pulses with rounded flanks, supplied to the time/voltage converter 12 are shown as a solid line in FIG. 5. Significantly, the respective waveshapes of the pulses are not constant during the respective pulse duration but, rather, are influenced by the ramp voltage UR.

If a ramp curve such as curve b of FIG. 3 is assumed (i.e. the ramp-shaped dropping progression first begins from time t1'), then the first pulse Ui (FIG. 2), having a duration t1, retains its curve upon transmission to the time/voltage converter 12. This results because the ramp signal UR has not decreased significantly by the time t1.

Figure 5A:
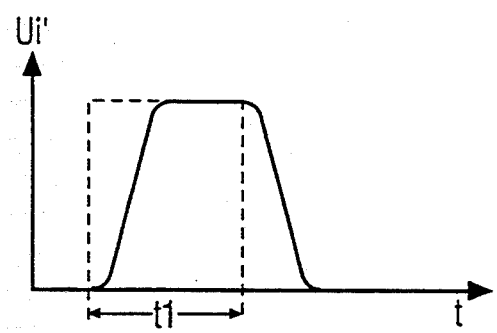
FIGS. 5a–5c are time/voltage waveforms useful for describing the operation of the FIG. 4 embodiment.
Figure 5B:
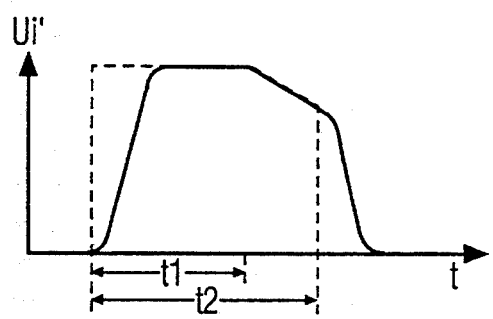

The second pulse Ui (FIG. 2b) with duration t2, however, has a modified voltage curve Ui', (FIG. 5b). This pulse Ui' has a constant amplitude until time t1 at which time its amplitude drops linearly in conformance with the waveshapes of ramp signal UR. The third pulse exhibits a comparable curve as shown in FIG. 5c.

Figure 5C:
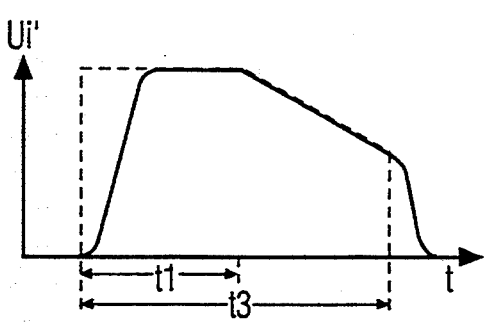
Figure 6:
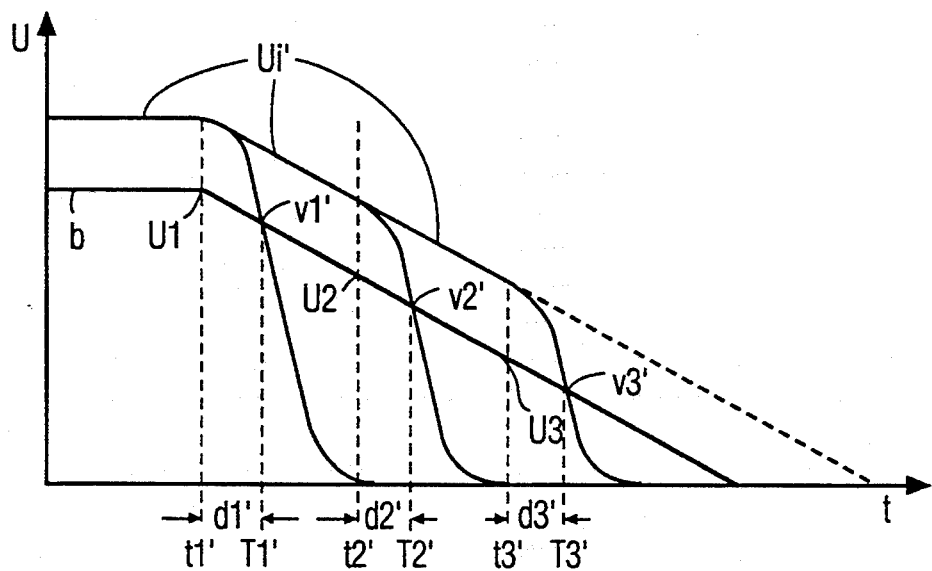
FIG. 6 is a voltage waveform diagram illustrating the transfer characteristics of the FIG. 4 embodiment.

The modified pulses shown in FIGS. 5a-5c which are applied to the input of the time/voltage converter 12 are illustrated in FIG. 6 juxtaposed with the ramp signal coupled to the element 12 via attenuator 22. The potential difference between the curves Ui' and the curve b is determined by the attenuator 22. It is essential that the curve of the voltages Ui' lies above the curve b when an pulse Ui is applied, i.e., when the switch 16 is closed.

As a result of the modification to the shapes of the pulses, the first pulse intersects the curve b at time T1'=t1'+d1' when the voltage equals v1'. Similarly, the second pulse intersects the curve b at a time T2'=t2'+d2' at a voltage value v2' and the third pulse at a time T3'=t3'+d3' at a voltage value v3'.

If identical rounding of the right-hand edges of the pulses is assumed, then the time differences d1', d2', and d3' are of equal size as a consequence of the essentially constant differential between the amplitudes of the pulses Ui and the ramp UR (curve b in FIG. 6). Consequently, the voltage differences (v1'-U1), (v2'-U2), and (v3'-U3) will be substantially similar. Therefore, inaccuracies in the time/voltage conversion are avoided. Moreover, an essentially linear amplification is rendered possible when using the facility 12a according to the invention for time/voltage conversion as part of the amplification unit 10.

Figure 7:
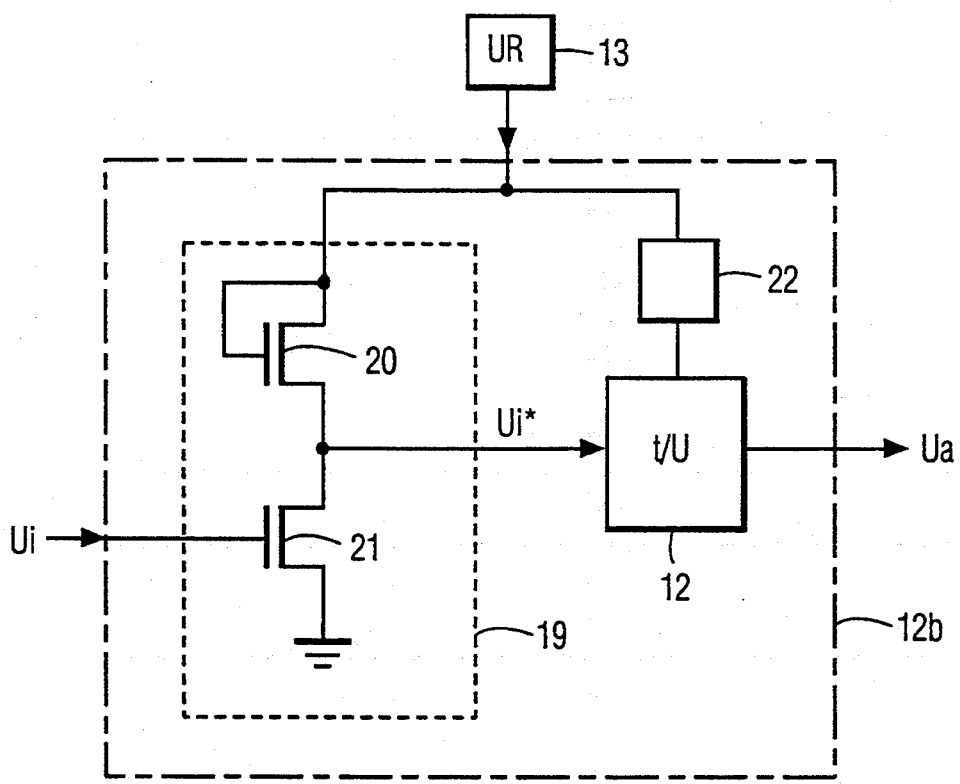
FIG. 7 is a partial block, partial schematic diagram of a second embodiment according to the invention.

If the voltage/time converter 11 signal provides an inverted pulse signal, the second embodiment according to FIG. 7 may be used. The inverting facility 12b for time/voltage conversion contains an inverter 19 as illustrated in FIG. 7, instead of the pulse converter stage 14 as shown in the previous embodiment (FIG. 4).

In this embodiment, the inverter 19 comprises two MOS transistors 20 and 21. The source electrode of the first transistor 20 is coupled with its gate electrode and with the ramp voltage generator 13. The drain electrode of the first transistor 20 is coupled with the source electrode of the second transistor 21. The pulse width modulated signal Ui is applied to the gate electrode of the second transistor 21, and the drain electrode of the second transistor 21 is connected to ground. At the common junction of the two transistors 20, 21, a voltage Ui* representing an inversion of signal Ui weighted with the voltage curve of the ramp voltage UR is exhibited. Due to the symmetrical structure of MOS transistors, the designated source and drain electrodes are interchangeable. The inverter 19 essentially modulates the signal UR with the signal Ui.

In a further embodiment wherein the voltage/time converter exhibits high output impedance, the ramp signal may be capacitively coupled directly onto the pulse signal at the output of the voltage time/converter. Alternatively, if the voltage/time converter is capacitively coupled to the time/voltage converter, a ramp-like signal may be impressed onto the pulses by selectively applying a constant current to one plate of the coupling capacitor.

Additional embodiments may contain at least one of the following variations:

The attenuator 22 is either eliminated or additional circuitry is added to it. In the attenuator's place or in addition to it, circuitry is added between the ramp voltage generator 13 and the pulse converter 14 or, respectively, the inverter 19. This circuitry increases the ramp voltage UR in an additive manner by adding a voltage, and/or in a multiplicative manner by amplifying the signal. This increased voltage is then sent to the pulse converter 14 or, respectively, the inverter 19;

The curve of the pulse produced by the pulse converter 14 or the inverter 19, respectively, may be such that the pulse voltages do not run parallel to an auxiliary voltage (i.e., ramp voltage UR or a voltage applied to components). Rather the pulse differential between the pulse amplitudes and the ramp UR may diverge. This results from the additive and/or multiplicative combination of pulse voltage values and the values of the temporal functions of the auxiliary voltage. The pulse curves may be attained through supplementary components such as diodes or other semiconductor elements which may be connected singly or in combination in parallel and/or in series with the components shown. As a result, non-linearities, somewhere within a system including a time/voltage converter, can be minimized or avoided.

Consequently, the system presented consists of a method and a preferred facility for executing the method that determines voltage values that correspond to the duration of pulses. To avoid non-linearities upon conversion, the amplitudes of the pulses applied to of the time/voltage converter are conditioned to match the curve of an auxiliary voltage used to form an output voltage. This auxiliary voltage may be a ramp voltage supplied by a ramp voltage generator or a voltage applied to components of the circuitry as described above. Use of this invention as a part of a whole system (e.g., an amplification unit) may reduce or compensate for corresponding non-linearities.

What is claimed is:

1. In a method for converting pulses of variable pulse widths to analog values having corresponding variable amplitude, of the type which provides a time varying signal and tracks the time varying signal during said pulse widths and holds the instantaneous value exhibited by the time varying signal at the termination of respective pulses, an improvement comprising:
   a. providing pulses of variable pulse width;
   b. conditioning said pulses to exhibit amplitudes which at least in part are similar in shape to said time varying signals; and
   c. tracking and holding said time varying signal with conditioned said pulses.

2. A method according to claim 1 where the time varying signal, at least part-time, changes linearly with time.

3. A method according to claim 1 where the time varying signal includes a constant amplitude portion and a ramped portion.

4. The method set forth in claim 1 wherein the step of conditioning comprises:
   providing a selectively enabled potential divider having an output terminal at which conditioned pulses are available;
   coupling said time varying signal to said potential divider in a manner to be selectively divided;
   coupling said pulses to selectively enable said potential divider such that said potential divider provides a predetermined potential when disabled and a potential representing said time varying signal when enabled.

5. The method set forth in claim 1 wherein the step of conditioning causes the amplitudes of conditioned pulses to maintain a predetermined potential difference with said time varying signal at least over a portion of respective pulse durations.

6. A device for converting pulses of variable pulse widths to analog values having corresponding variable amplitude, of the type which provides a time varying signal and tracks the time varying signal during said pulse widths and holds the instantaneous value exhibited by the time varying signal at the termination of respective pulses, an improvement comprising:
   means for providing pulses of variable pulse width;
   means for conditioning said pulses to exhibit amplitudes which at least in part are similar in shape to said time varying signals; and
   means for tracking and holding said time varying signal with conditioned said pulses.

7. The apparatus set forth in claim 6 wherein said means for conditioning comprises:
   an inverter having a supply terminal coupling to said time varying signal, an input terminal arranged for receiving said pulses and an output terminal at which conditioned pulses are available.

8. The apparatus set forth in claim 6 wherein said means for conditioning comprises:
   first and second resistors;
   a switch means having a selectably enabled conduction path coupled between said first and second resistors;
   an output terminal coupled to an interconnection of said switch means and one of said first and second resistors;
   a source of time varying potential coupled across the connection of said first and second resistors and said switch means; and
   means for coupling said pulses to selectively enable said switch means.

9. The apparatus set forth in claim 6 wherein said means for conditioning includes means for maintaining a predetermined potential difference between said time varying signal and the amplitude of said pulses at least over a portion of respective pulse durations.

10. The apparatus set forth in claim 6 wherein the means for conditioning comprises means for modulating said time varying signal with said pulses of variable width.

11. In combination apparatus comprising:
   an amplitude-to-pulse-width converter for providing pulses of variable width;
   a source of time varying signal;
   a pulse-width-to-amplitude converter of the type which tracks and holds a time varying signal, said pulse width to amplitude converter having a pulse input terminal and a time varying signal input terminal;
   means coupled between said amplitude to pulse width converter and said pulse input terminal, and responsive to said pulses and said time varying signal, for applying pulses to said pulse input terminal having amplitudes corresponding in part to the character of said time varying signal; and
   means for coupling said source of time varying signal to said time varying signal input terminal.

12. The apparatus set forth in claim 11 wherein said means for coupling said source of time varying signal, alters the amplitude of said time varying signal.

* * * * *